United States Patent

Hong et al.

[11] Patent Number: 5,852,313
[45] Date of Patent: Dec. 22, 1998

[54] FLASH MEMORY CELL STRUCTURE HAVING A HIGH GATE-COUPLING COEFFICIENT AND A SELECT GATE

[75] Inventors: Gary Hong, Hsin-Chu; Patrick Wang; Wenchi Ting, both of Taipei, all of Taiwan

[73] Assignee: United Semiconductor Corp., Taiwan

[21] Appl. No.: 967,940

[22] Filed: Nov. 12, 1997

[30] Foreign Application Priority Data

Jul. 21, 1997 [TW] Taiwan .................................. 86110295

[51] Int. Cl.$^6$ .................................................. H01L 29/792
[52] U.S. Cl. ........................... 257/326; 257/316; 438/258
[58] Field of Search ..................................... 257/314–326; 438/257, 258

[56] References Cited

U.S. PATENT DOCUMENTS

| 4,642,673 | 2/1987 | Miyamoto et al. | 257/319 |
|---|---|---|---|
| 5,084,745 | 1/1992 | Iizuka | 257/319 |
| 5,256,584 | 10/1993 | Hartmann | 438/257 |
| 5,686,749 | 11/1997 | Matsuo | 257/326 |

Primary Examiner—Jerome Jackson
Assistant Examiner—David B. Hardy
Attorney, Agent, or Firm—Rabin & Champagne P.C.

[57] ABSTRACT

A flash memory cell structure comprising a semiconductor substrate having a first transistor and a second transistor formed thereon. The first transistor has a stacked gate and a first source/drain regions, wherein the stacked gate further includes a floating gate and a control gate. The control gate is formed above the floating gate. The second transistor is electrically connected in series with the first transistor. The second transistor functions as a select transistor and includes a gate and a second source/drain regions.

8 Claims, 2 Drawing Sheets

FLASH MEMORY CELL STRUCTURE HAVING A HIGH GATE-COUPLING COEFFICIENT AND A SELECT GATE

BACKGROUND OF THE INVENTION

1. Field of Invention

The present invention relates to a flash memory cell structure. More particularly, the present invention relates to a flash memory cell structure having a high gate-coupling coefficient and a select gate. The cell structure of this invention can overcome conventional over-programming problems and requires only a low flash memory gate voltage for programming data into or erasing data from the memory utilizing the Fowler-Nordheim tunneling (F-N tunneling) effect.

2. Description of Related Art

Using a conventional NOR-type flash memory structure as an example, when data needs to be programmed into a flash memory cell, a low voltage is usually applied to the gate. On the other hand, when data needs to be erased from the flash memory cell, a high voltage is normally applied to the gate. In general, however, if the memory cell becomes a depletion-mode transistor due to the overdrawing of charges from the flash memory gate, then the phenomenon known as over-programming may occur leading to erroneous data storage.

FIG. 1 is a circuit diagram showing the circuit layout of a conventional NOR-type flash memory. The NOR-type flash memory operates in such a way that when data needs to be programmed into a specified cell, the specified cell will be driven to a low threshold voltage state; and when data needs to be erased from a specified cell, then the specified cell will be driven to a high threshold voltage state. When a peripheral circuit needs to access a particular memory cell for retrieving data, for example, flash memory cell $C_1$ of FIG. 1, suitable voltages are applied to the corresponding bit line and the corresponding word line. However, if flash memory cell $C_2$ has been over-programmed, the flash memory cell $C_2$ becomes a depletion-mode transistor having a threshold voltage smaller than 0 V. In other words, the flash memory cell $C_2$ has a negative threshold voltage. Therefore, a leakage current $I_0$ will flow from the $C_1$ flash memory cell, following the direction of the arrow in FIG. 1, through the flash memory cell $C_2$ to the ground forming a leakage path. Under such circumstances, current sensor along the circuit will register a current coming from the over-programmed $C_2$ memory cell through the bit line and then an erroneous bit of data is retrieved.

FIG. 2 is a top view showing a flash memory cell of a conventional NOR-type flash memory. As shown in FIG. 2, there is a contact window 20 above a drain region for connecting electrically with the drain regions of other memory cells. Also included in the flash memory cell is a stacked gate structure 24 having two layers. The two-layered stacked gate 24 includes a lower floating gate 26 and an upper control gate 28. The stacked gate 24 has a length of L and a channel width of W. Dimensions L and W follows the design rules such that the flash memory cell has the smallest device dimensions and the highest density in the wafer possible. With the aforementioned type of structure, the overlapping area between the floating gate 26 and the upper control gate 28 is small, and the gate-coupling coefficient $K_{cg}$ has a value between 0.45 to 0.65. A low $K_{cg}$ may lead to a need for a higher applied gate voltage before a memory erase operation can be carried out. For example, a high gate voltage of between 15 V to 18 V may need to be applied, and so device dimensions of a flash memory cell can hardly be reduced any further. In addition, the thickness of the gate oxide layer surrounding the high voltage transistors must also be increased, for example, an increase to about 200 angstroms is required which may lead to additional developmental problems. In light of the foregoing, there is a need in the art for improving a flash memory structure.

SUMMARY OF THE INVENTION

Accordingly, the present invention is directed to provide a flash memory cell structure that can overcome the erroneous data retrieval caused by over-programming in conventional memory, and requires only a low operating gate voltage for flash memory cell operation.

To achieve these and other advantages and in accordance with the purpose of the invention, as embodied and broadly described herein, the invention includes a flash memory cell structure comprising a semiconductor substrate having a first transistor and a second transistor formed thereon. The first transistor has a stacked gate and a first source/drain regions, wherein the stacked gate further includes a floating gate and a control gate. The control gate is formed above the floating gate. The second transistor is electrically connected in series with the first transistor. The second transistor functions as a select transistor and includes a gate and a second source/drain regions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
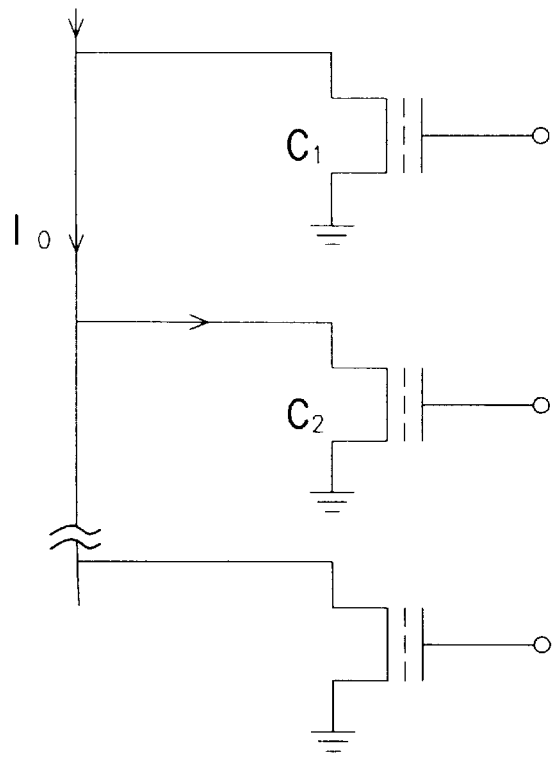
FIG. 1 is a circuit diagram showing the circuit layout of a conventional NOR-type flash memory.
Figure 2:
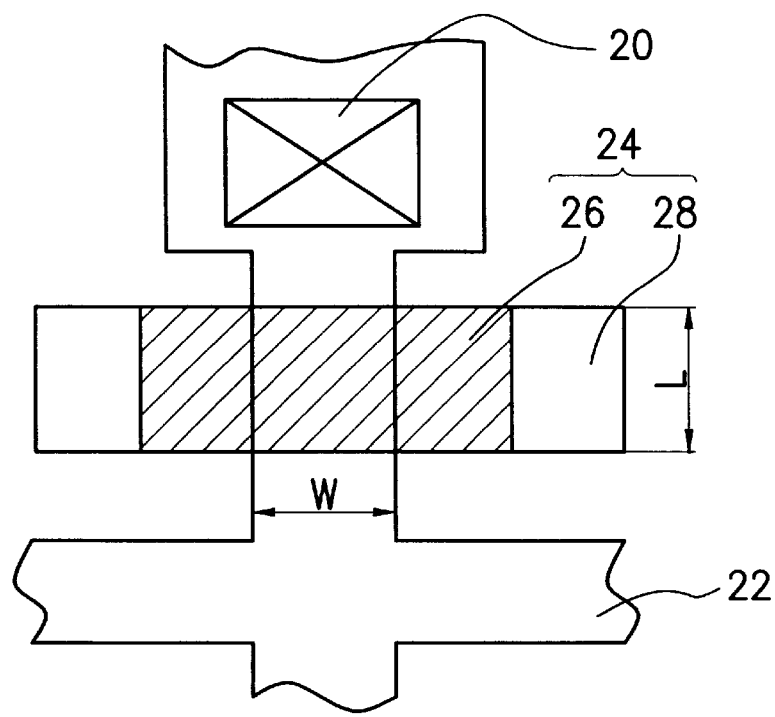
FIG. 2 is a top view showing a flash memory cell of a conventional NOR-type flash memory.

Reference will now be made in detail to the present preferred embodiments of the invention, examples of which are illustrated in the accompanying drawings. Wherever possible, the same reference numbers are used in the drawings and the description to refer to the same or like parts.

In accordance with the invention, there is provided a flash memory structure, for example, a NOR-type flash memory structure, having a high gate-coupling coefficient. The flash memory structure not only can overcome conventional erroneous data retrieval due to over-programming, but also can lower the required gate operating voltage of a flash memory.

There is a close relationship between the gate-coupling coefficient $K_{cg}$ and the gate voltage required during data programming and data erase operations. In general, the smallest memory cell gate voltage required in a data programming or a data erase step is determined by the smallest electric field needed for F-N tunneling to occur between the floating gate and the drain region. During a data programming operation, the electric field passing through the tunneling oxide layer can be calculated by the following formula:

$$E_{program} = (V_d - Q_{fg}/C_{total} - V_d * K_d)/t_{tunnel\ oxide} \quad (1)$$

where $Q_{fg}$ is the total amount of charges in the floating gate, $C_{total}$ is the total capacitance of the floating gate, $t_{tunnel\ oxide}$ is the thickness of the tunneling oxide layer, $V_d$ is the voltage applied to the drain terminal and $K_d$ is the coupling coefficient of the drain. From formula (1), it can be seen that a smaller $V_d$ value will produce a smaller $E_{program}$, and from here the smallest operational voltage $V_d$ for a memory cell can be determined. Because the gate-coupling coefficient $K_{cg}$, the drain-coupling coefficient $K_d$, the channel-coupling coefficient $K_{CH}$ and the source-coupling coefficient $K_s$ must be added to 1, that is, $K_{cg} + K_d + K_{CH} + K_s = 1$, if a small value of $V_d$ is required, value of the gate-coupling coefficient $K_{cg}$ must be large.

On the other hand, during a data erase operation, the electric field passing through the tunneling oxide layer can be calculated by the following formula:

$$E_{erasure} = (V_{cg} * K_{cg} + Q_{fg}/C_{total})/t_{tunnel\ oxide} \quad (2),$$

where $V_{cg}$ is the gate voltage. From formula (2), an inverse relationship between the value of the gate voltage $V_{cg}$ and the value of the gate-coupling coefficient $K_{cg}$ can be discovered. That is, when the value of $K_{cg}$ is large, the value of $V_{cg}$ becomes small. Conversely, if the required value for $V_{cg}$ is small, the gate-coupling coefficient $K_{cg}$ must be large. This result is very similar to the result derived from formula (1), meaning that when the gate-coupling coefficient $K_{cg}$ is large, gate voltage $V_{cg}$ required for the proper operation of a memory cell becomes small.

Hence, a flash memory cell structure having a high gate-coupling coefficient $K_{cg}$ of about 0.75 compared with the conventional values of between 0.45 to 0.65 is provided according to this invention. The required gate voltage $V_{cg}$ for the operation of a flash memory cell is greatly lowered, for example, from about 15 V to 18 V down to about 13 V to 14 V. Various applied voltages at the terminals of a flash memory cell during a data programming, a data erase and a data read operation according to this invention are shown in Table 1.

$T_2$ serve as selective switches for the opening and closing the electrical circuit to memory cells $C_1$ and $C_2$, respectively. For example, when the desired data in memory cell $C_1$ needs to be retrieve, select transistor $T_1$ is turned on to make a conductive circuit, otherwise the select transistor $T_1$ is shut off. Similarly, when the desired data in memory cell $C_2$ needs to be retrieve, select transistor $T_2$ is turned on to make a conductive circuit, otherwise the select transistor $T_2$ is shut off. When data in a specific memory cell is needed by the peripheral circuits, for example, the data in flash memory cell $C_1$, appropriate voltages are applied to the word line and bit line. Preferably, a voltage of about 1.5 V is applied to the bit line, and the word line should include the specific memory cell $C_1$ and the electrically connected select transistor $T_1$. During data retrieval operation, if there is over-programming in one of the memory cells, for example, the flash memory cell $C_2$, and so turned into a depletion-mode transistor having a threshold voltage smaller than 0 V or negative threshold voltage, current will flow from the flash memory cell $C_1$ into $C_2$ in a conventional flash memory. However, in this invention, the select transistor $T_2$ is shut off, and so no current can flow into flash memory cell $C_2$ from $C_1$. Therefore, the stored data in memory cell $C_1$ is protected, and current sensing device along the circuit will not detect the leakage current on bit line caused by the over-programming of memory cell $C_2$.

Figure 4:
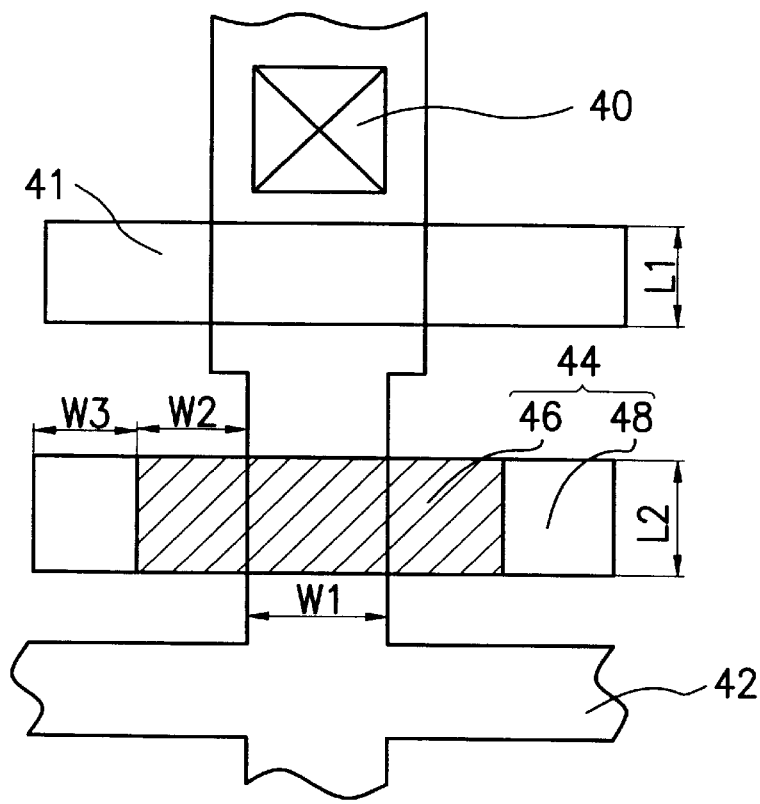
FIG. 4 is a top view showing a flash memory cell of a NOR-type flash memory according to the preferred embodiment of this invention.

FIG. 4 is a top view showing a flash memory cell of a NOR-type flash memory according to the preferred embodiment of this invention. As shown in FIG. 4, a contact window 40 is located above the drain terminal of the memory cell, and also serves to connect electrically with the drain terminals of other memory cells. The invention includes a stacked gate structure 44 having two layers comprising a lower floating gate 46 and an upper control gate 48. The stacked gate 44 preferably has a length L2 of about 0.5 micrometer. The invention also includes a select gate structure 41 formed in parallel to the stacked gate structure 44 and electrically connected in series with the stacked gate 44. The select gate 41 preferably has a length C1 of about 0.6 micrometer. In addition, the channel width W1 is preferably about 0.5 micrometer, the gap width W3 between the end of floating gate 46 and the end of control gate 48 is preferably about 0.25 micrometer, and the width W2 of the floating gate 46 beyond the channel region is preferably about 1.25 micrometer. In general, the overall width of the memory cell (i.e., W1+2(W2)+2(W3) is preferably about 3.5 micrometers, and the overall height of the memory cell is preferably about 3.0 micrometers.

As a summary, advantages of this high gate-coupling coefficient flash memory structure includes:

TABLE 1

|  | Drain Voltage $V_d$ | Select Gate Voltage $V_{sg}$ | Control Gate Voltage $V_{cg}$ | Source Voltage $V_s$ | Substrate Voltage $V_{sub}$ |
| --- | --- | --- | --- | --- | --- |
| Program | 10 V | 13 V | 0 V | 0 V or Open | 0 V |
| Erase | Open | 0 V | 14 V | 0 V | 0 V |
| Read | 1.5 V | 5 V | 5 V | 0 V | 0 V |

Figure 3:
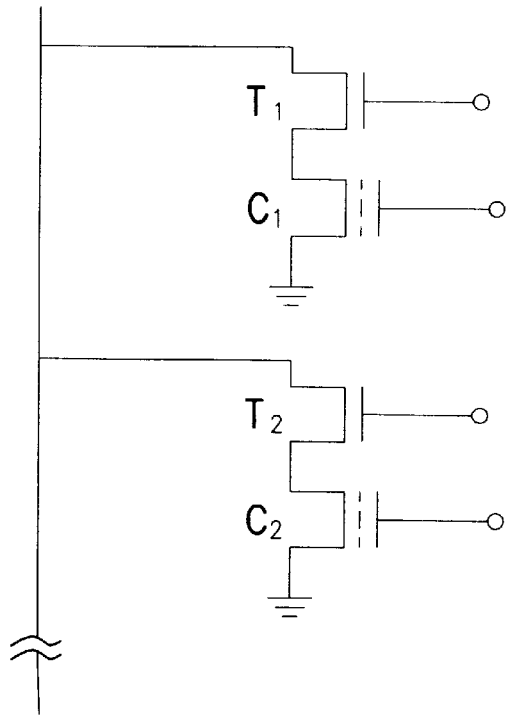
FIG. 3 is a circuit diagram showing the circuit layout of a NOR-type flash memory according to the preferred embodiment of this invention.

FIG. 3 is a circuit diagram showing the circuit layout of a NOR-type flash memory according to the preferred embodiment of this invention. As shown in FIG. 3, each flash memory unit includes a memory cell and a select transistor electrically connected in series with the memory cell. For example, memory cell $C_1$ is electrically connected to a select transistor $T_1$, or memory cell $C_2$ is electrically connected to select transistor $T_2$. Select transistors $T_1$, and (1) The select gate structure 41 included in this invention serves as an ON/OFF selection switch for the stacked gate 44. That is, when stacked gate 44 data is required, the select gate 41 is switched on to make a conductive circuit and shut off when the operation ends. This helps to shut off any unwanted leakage current due to over-programming, and maintain data integrity.

(2) The flash memory structure provided by this invention has a larger overlapping area between the floating gate 46 and the control gate 48 than a conventional flash memory structure. Therefore, a higher gate-coupling coefficient value of about 0.75 is obtained. One big advantage of this is that the voltage applied to the gate for operating a flash memory cell can be greatly reduced, for example, an operating voltage of just 13 V to 14 V is required.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high gate-coupling coefficient flash memory cell structure comprising:

a semiconductor substrate;

a first transistor having a stacked gate and first source/drain regions above the semiconductor substrate, wherein the stacked gate includes a floating gate and a control gate, and that the control gate is formed above the floating gate, with the control gate and floating gate overlapping over an area about 3 micrometers long by 0.5 micrometers wide; and a second transistor having a gate and second source/drain regions electrically connected in series with the first transistor such that the second transistor functions as a select transistor.

2. The structure of claim 1, wherein the select transistor functions as an ON/OFF switch for the first transistor such that when data residing in the first transistor is needed, the select transistor is switched on to create a conducting circuit for data retrieval, and the select transistor is shut off when an operation ends.

3. The structure of claim 1, wherein the gate-coupling coefficient of the memory cell having the preferred overlapping area is about 0.75.

4. The structure of claim 1, wherein the length of the floating gate is preferably about 0.5 micrometer.

5. The structure of claim 1, wherein the length of the control gate is preferably about 0.5 micrometer.

6. The structure of claim 1, wherein the length of the second gate is preferably about 0.6 micrometer.

7. A high gate-coupling coefficient flash memory cell structure comprising:

a semiconductor substrate;

a first transistor having a stacked gate and first source/drain regions above the semiconductor substrate, wherein the stacked gate includes a floating gate and a control gate, and that the control gate is formed above the floating gate; and a second transistor having a gate and second source/drain regions electrically connected in series with the first transistor such that the second transistor functions as a select transistor, wherein a channel width below the stacked gate is about 0.5 micrometer.

8. A high gate-coupling coefficient flash memory cell structure comprising:

a semiconductor substrate;

a first transistor having a stacked gate and first source/drain regions above the semiconductor substrate, wherein the stacked gate includes a floating sate and a control gate, and that the control gate is formed above the floating gate; and a second transistor having a gate and second source/drain regions electrically connected in series with the first transistor such that the second transistor functions as a select transistor, wherein a total width of the memory cell is about 3.5 micrometers.

* * * * *